United States Patent [19]

Smayling et al.

[11] Patent Number: 5,844,839
[45] Date of Patent: Dec. 1, 1998

[54] PROGRAMMABLE AND CONVERTIBLE NON-VOLATILE MEMORY ARRAY

[75] Inventors: Michael C. Smayling, Missouri City, Tex.; Giulio Marotta; Giovanni Santin, both of Rieti, Italy; Pietro Piersimoni, Fabriano, Italy; Cristina Lattaro, Aquila, Italy

[73] Assignee: Texas Instruments Incorporated, Dallas, Tex.

[21] Appl. No.: 684,962

[22] Filed: Jul. 19, 1996

Related U.S. Application Data

[60] Provisional application No. 60/001,235, Jul. 19, 1995.
[51] Int. Cl.$^6$ ............................ G11C 11/34; G11C 7/00
[52] U.S. Cl. ............................ 365/185.23; 365/185.26; 365/185.29; 365/185.33; 365/218
[58] Field of Search ........................ 365/185.05, 185.09, 365/185.12, 185.23, 185.26, 185.29, 185.33, 218

[56] References Cited

U.S. PATENT DOCUMENTS 5,359,558  10/1994  Chang et al. ................... 365/185.12
5,559,742   9/1996  Lee et al. ........................ 365/185.09

*Primary Examiner*—David C. Nelms
*Assistant Examiner*—Trong Quang Phan
*Attorney, Agent, or Firm*—J. Dennis Moore; James C. Kesterson; Richard L. Donaldson

[57] ABSTRACT

A non-volatile, integrated circuit memory, such as a Flash EPROM, including an array 1 of memory cells 10, each cell having a floating gate 14 for programming the cell and a control gate 11 for reading the cell, the array having a plurality of row lines 15, a plurality of column lines 25 and a plurality of output lines 18. Included is a decoder circuit 16 having a plurality of input lines 94, 96, for each row in the array, and having as outputs the row lines 15. The decoder circuit includes a decoder logic circuit associated with each row line, the decoder logic circuit including a plurality of low power logic devices 84–90 interconnected to perform a predetermined decoding function on the signals on the input lines for the associated row line to apply a signal to an associated row node when the decoder logic circuit determines that the associated row line is selected. The decoder circuit also includes a high power pass device 82 associated with each row line, having one of its source and drain connected to the associated row node, having the other of its source and drain connected to a row line and having its gate connected to a first voltage, lower than the high voltage, so as to couple the signal on the row node to the row line. Finally, a keeper circuit 102 is provided, associated with each row line and coupled to the high voltage for sensing the signal on the row line and in response thereto for coupling the high voltage to the row line. The memory has high speed, since the decoder logic is performed by low power devices. In addition, in fabrication the memory is readily convertible to a permanent ROM by eliminating the formation of the floating gate, bypassing the high power pass device and not connecting the keeper circuit.

2 Claims, 9 Drawing Sheets

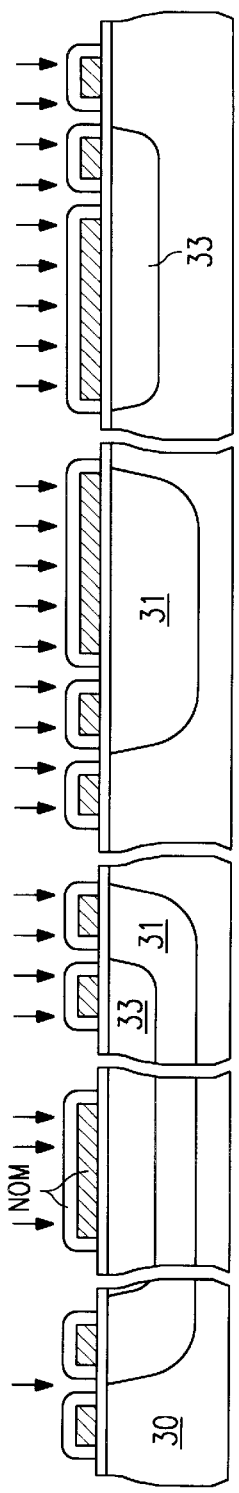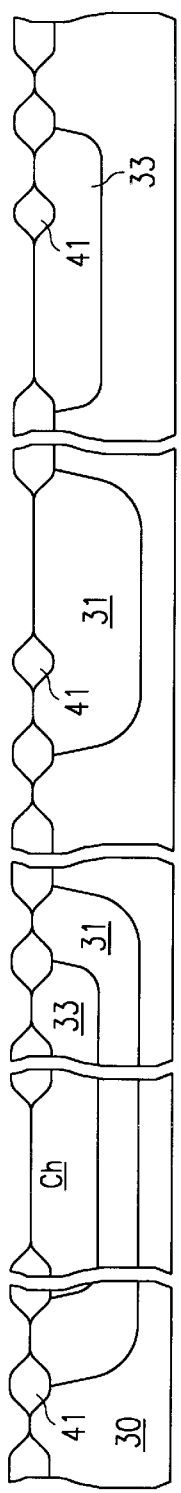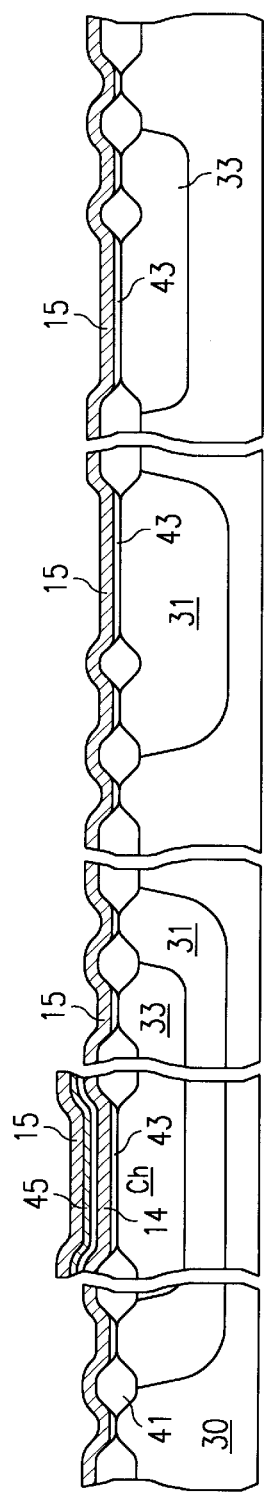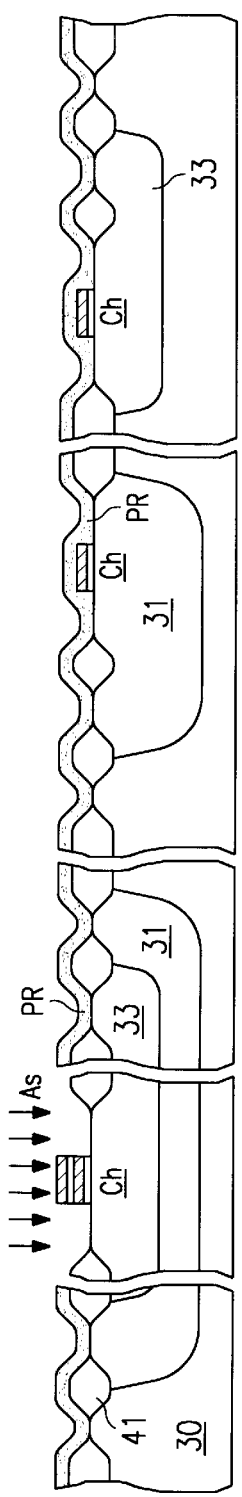

PROGRAMMABLE AND CONVERTIBLE NON-VOLATILE MEMORY ARRAY

This application claims priority under 35USC 119 (c)(1) of provisional application number 60/001,235, filed on Jul. 19, 1995.

TECHNICAL FIELD OF THE INVENTION

This invention relates to integrated circuit processes and integrated circuits produced thereby, and more particularly to non-volatile memory cells, such as EPROMs, EEPROMs and Flash EPROMS, and the fabrication of arrays thereof.

BACKGROUND OF THE INVENTION

Several types of programmable, non-volatile memory cells are known and used today. The Erasable Programmable Read Only Memory, or EPROM, cells are memory cells including a field effect transistor, or FET device, that is provided with a floating gate that can be charged, on a non-volatile basis, with electrons using avalanche injection. A device having such a charged floating gate will not conduct, even when its control gate has a positive, read-level voltage applied thereto, while one not having such a charged floating gate will conduct when such voltage is applied to its control gate. Thus, an array of such cells can be selectively programmed.

The charge remains on the floating gate indefinitely, for all practical purposes, unless the array is erased. Such arrays are erased by the application of ultraviolet radiation thereto. The Electrically Erasable Programmable Read Only Memory, or EEPROM, cells are memory cells that are similar to EPROMs in that they include a field effect transistor, or FET device, that is provided with a floating gate that can be charged with electrons using avalanche injection, but each cell is individually erasable electrically. EEPROM arrays are thus more flexible than EPROM arrays, but are significantly larger than EPROM arrays. Finally, Flash EPROMS, sometimes referred to as Flash memories, also have a floating gate that can be charged using avalanche injection. However, Flash EPROM cells are erasable using Fowler-Nordheim tunnelling, an electrical effect rendering unnecessary the application of light to the array. In Flash EPROM arrays, as in EPROM arrays, the entire array is erased, rather than individual cells as with EEPROMs. All of the aforementioned arrays are referred to collectively herein as Non-Volatile Programmable Arrays, or NVPAs.

A disadvantage of all of these NVPA arrays is that rather high voltages must be applied to the cells to program them and, in the case of EEPROMs and Flash memories, to erase them. These voltages are typically in the order of fifteen volts. As a consequence, the devices involved in deriving the row and column signals have to be made quite large to withstand these voltages. Device lengths of the order of two microns are typical for such high voltage devices. Such devices not only take up more space than low voltage devices, which, by contrast have channel lengths of the order of 0.8 microns, but they also have significantly slower access times than low voltage devices. Moreover, semiconductor processing technology advances are driving device sizes smaller and smaller. While this is providing benefits such as including faster devices as well as allowing more devices on a chip of a given size, the high voltage devices do not, as a rule, scale with the low voltage devices. This is because the programming and erasing voltages required are still of the same order in the smaller technologies. Thus, the high voltage devices must remain roughly the same size even in these smaller technologies. As a result, as device dimensions shrink with technology advances, NVPA arrays cannot be shrunk to the degree desired, and speed improvements are less than desired, as well.

Another problem in the use of NVPA arrays arises from their application. For example, embedded Flash memory and EPROM memories are commonly used in digital signal processors, or DSPs, and in microcontroller units, or MCUs, for prototyping by the developers of these complex chips. For applications in which the embedded array stores only program information, and no data, a permanent ROM, or Mask ROM, version of the chip is later developed to give lower cost in high production volume. However, this requires replacing the NVPA module with a completely different ROM array module. This, in turn, requires new chip routing, floorplanning and the like, which is time consuming, expensive, and often results in using a ROM module which is larger than the NVPA module, since the typical ROM, having Contact or Via programming, has a larger cell size than that of an NVPA.

A further problem, in particular with respect to Flash memory, is that, while it was mentioned above that erasure of these memories is typically of the entire array, it is desirable in many applications to be able to erase at least segments of the array only, so as to preserve the programming in non-selected segments. Segmenting of Flash memories is known. However, this requires dividing the array into separate physical areas for each logical sector, which adds delay to the Read path and also causes a penalty in silicon area.

Thus, there is a need for improvements to Non-Volatile Programmable Arrays of memory cells to overcome the aforementioned problems. The present invention accomplishes this.

SUMMARY OF THE INVENTION

According to the present invention there is provided a non-volatile, integrated circuit memory, such as a Flash EPROM, including an array of memory cells, each cell having a floating gate for programming the cell and a control gate for reading the cell, the array having a plurality of row lines, a plurality of column lines and a plurality of output lines. Included is a decoder circuit having a plurality of input lines for each row in the array, and having as outputs the row lines. The decoder circuit includes a decoder logic circuit associated with each row line, the decoder logic circuit including a plurality of low power logic devices interconnected to perform a predetermined decoding function on the signals on the input lines for the associated row line to apply a signal to an associated row node when the decoder logic circuit determines that the associated row line is selected. The decoder circuit also includes a high power pass device associated with each row line, having one of its source and drain connected to the associated row node, having the other of its source and drain connected to a row line and having its gate connected to a first voltage, lower than the high voltage, so as to couple the signal on the row node to the row line. Finally, a keeper circuit is provided, associated with each row line and coupled to the high voltage for sensing the signal on the row line and in response thereto for coupling the high voltage to the row line. The memory has high speed, since the decoder logic is performed by low power devices. In addition, in fabrication the memory is readily convertible to a permanent ROM by eliminating the formation of the floating gate, bypassing the high power pass device and not connecting the keeper circuit.

These and other features of the invention that will be apparent to those skilled in the art from the following detailed description of the invention, taken together with the accompanying drawings.

DESCRIPTION OF THE DRAWINGS

In the drawings:

FIGS. 3(a)–3(k) are elevation views in section of the semiconductor device of FIG. 2, taken along the line a—a of FIG. 2 at various stages of construction;

DETAILED DESCRIPTION OF THE PREFERRED EMBODIMENT

Process Overview

Figure 1:
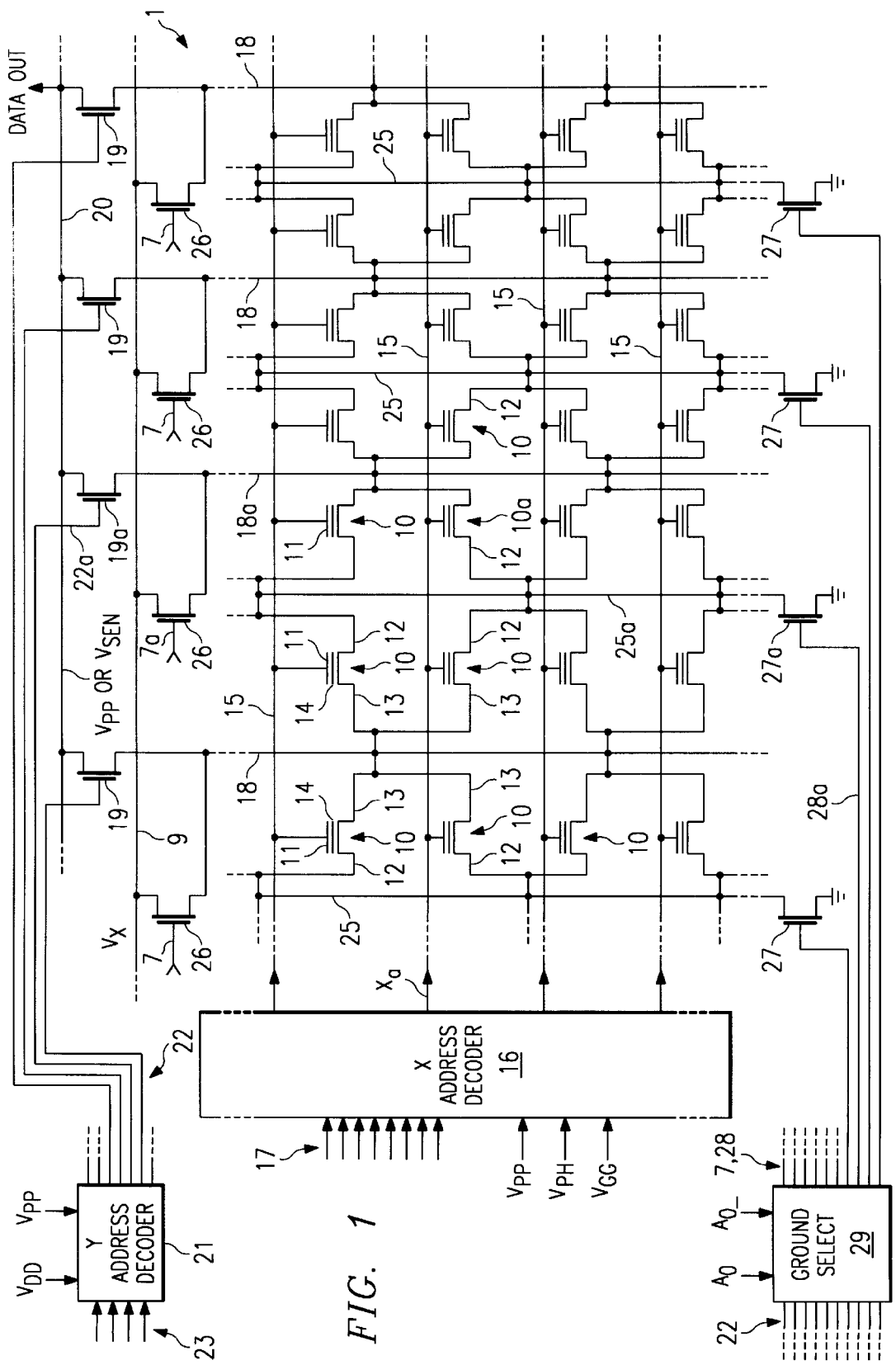
FIG. 1 is a representation of an array of memory cells and associated circuitry according to this invention.

The process used in the manufacture of the preferred embodiment includes forming a floating-gate cell, a line of such cells, or an array of such cells, in an isolated well. At the same time, high-voltage and low-voltage logic transistors are formed. During an erasing operation the source of each memory cell to be erased is driven to a first positive voltage while the control gate is at reference voltage. Using the inventive isolated-well disclosed herein, the drain and the channel of each cell is also driven to a voltage nearly equal to the first positive voltage by driving the isolated well to a second positive voltage that is equal to the first positive voltage, thus eliminating the field-plate breakdown-voltage problem. Because there is no need for a diffused source-junction erase window under the floating gate, each floating-gate cell is a one-transistor cell having roughly the same area as that of an ultra-violet-erasable EPROM cell made using the same technology. Without the prior-art requirement for a separate tunnelling region near the source, a masking step and a phosphorus implant are eliminated. The preferred embodiment is realized in an X-cell memory array that has the small size of an ultra-violet-erasable EPROM and that has manufacturing complexity slightly greater than that of an ultra-violet-erasable EPROM. The high-voltage N and P-channel transistors and low voltage N and P-channel transistors of a microcontroller are formed on the chip as the memory cells are formed.

The nonvolatile memory array is encased in a P-well, and the P-well encased in a deep N-well, the two wells separating the memory array from the integrated circuit substrate and from the other circuitry of the integrated circuit. At the same time the deep N-well is formed for the nonvolatile memory array, deep N-wells are formed for the high-voltage P-channel transistors of the logic circuitry. At the same time the P-well is formed for the nonvolatile memory array, P-wells are formed for the low-voltage N-channel transistors.

With the control gate and the integrated circuit substrate at 0V, the deep N-well allows application of a positive voltage of perhaps +16V to the source/drain diffusions and the P-well of the nonvolatile memory array during erasure. Alternatively, with the substrate at 0V, a smaller positive erasure voltage (perhaps +10V) is applied to the source/drain diffusions and the P-well, and a negative erasure voltage (perhaps −6V) is applied to the control gate. Application of those voltages permits the cells of the memory array to be erased without the causing field-plate stress at the p-n junctions between the source/drain diffusions and the P-well.

The term "well" as used herein refers to a relatively large diffusion region formed in a semiconductor substrate. Such diffusion regions are sometimes referred to as "wells", "tanks" or "tubs". The "wells", "tanks" or "tubs" are generally large enough to contain the diffusion regions and channels of active circuit elements.

The process results in a memory array with rows and columns of cells having a size and structure similar to those of a prior-art ultra-violet-erasable X-type arrays and includes high- and low-voltage logic circuitry on the same chip. The final device combines logic transistors and a memory with a dense flash EPROM circuitry, both formed with the manufacturing ease of that for an ultra-violet-erasable EPROM structure.

Process Details

Referring now to FIG. 1, a memory device is shown which has an Array 1 of rows and columns of memory cells 10, each of which is an insulated gate field effect transistor having a control gate 11, a source 12 and a drain 13. The cells 10 include a floating gate 14 between the control gate 11 and the channel between source 12 and drain 13.

The control gates 11 of all cells in each row are connected to one of a set of row lines 15. Row lines 15 are connected to an X address decoder 16 which selects one of row lines 15 based on a row address on lines 17. In a read operation, the selected one of the lines 15 goes high, the others remain low.

The drains 13 of adjacent cells 10 are connected in common to Y output lines 18. The lines 18 are connected through Y output select transistors 19 to a Y output line 20. The gates of the transistors 19 are connected to a Y address decoder 21 via lines 22 which function to apply a supply-level voltage $V_{DD}$ (about +3 to +5 volts) to one of the lines 22 and hold the others at ground based on an address input on lines 23.

The sources 12 of adjacent cells 10 are connected in common to another set of column lines 25 which function as virtual ground lines. Each line 25 is connected through a column select transistor 27 to ground. The gates of all of these transistors 27 are connected via lines 28 to a ground selector 29 which receives the output lines 22 from the Y address decoder 21, along with the least significant address bit $A_o$ and its complement $Ao\_$, and functions to activate only one of the lines 28 for a given Y address.

In the read mode, the X address decoder 16 functions, in response to row line address signals on lines 17 and to a signal from a microprocessor, to apply $V_{DD}$ to the selected row line Xa (and, thus, the selected control gate 11), and to apply ground to deselected row lines 15. Row line Xa is one of row address lines 15. The Y address decoder 21 functions, in response to column address signals on lines 23, to turn transistor 19a on by applying $V_{DD}$ on line 22a, causing a sense amplifier (not shown) connected to the DATA OUT terminal to apply a preselected positive voltage Vsen (about +1 to +1.5 volts) to the selected drain-column line 18a. Deselected drain-column lines 18 may be allowed to float (connected to the high impedance of off transistors 19), disconnected from the sense amplifier. The ground select circuit 29 functions to turn transistor 27a on, connecting the particular source-column line 25a to ground. All other source-column lines 25 are connected to Vx, which is at the same level as $V_{SEN}$, through this associated transistors 26. At the same time, line 7a operates to turn transistors 26a off. All other transistors 26 are on at this time, causing all deselected source-column lines 25 to be at Vx. The conductive or nonconductive state of the cell 10a connected to the selected drain-column line 18a and the selected row line Xa is detected by the sense amplifier connected to the DATA OUT terminal.

In a write or program mode, the X address decoder 16 may function, in response to row line address signals on lines 17, and to signals from a microprocessor, to place a preselected first programming voltage $V_{GG}$ (about +11 to +13V) on a selected row line Xa, including the control-gate conductor 11 of selected cell 10a. Y address decoder 21 also functions to place a second programming voltage Vpp (about +5 to +8V) on a selected drain-column line 18a and, therefore, the drain region 13 of selected cell 10a. Deselected drain-column lines 18 are floated. The selected source-column line 25 is connected to ground through transistor 27a. Deselected source-column lines 25 are allowed to float. Deselected row lines are grounded. These programming voltages create a high current (drain 13 to source 12) condition in the channel of the selected memory cell 10a, resulting in the generation near the source-channel junction of channel-hot electrons and/or avalanche-breakdown electrons (hot carriers) that are injected across the channel oxide to the floating gate 14 of the selected cell 10a. The programming time is selected to be sufficiently long to program the floating gate 14 with a negative potential of about −2V to −6V with respect to the channel region. The electrons injected into the floating gate 14, in turn, render the source-drain path under the floating gate 14 of the selected cell 10a nonconductive, a state which is read as a "zero" bit. Unprogrammed cells 10 have source-drain drain paths under the floating gates 14 that remain conductive, and those cells 10 are read as "one" bits.

During the program and read operation examples described above, cells 10 located in P-wells 33 and N-wells 31 (see FIG. 2) are programmed and erased with the P-wells 33 and N-wells 31 at 0V.

Placing Array 1 in the low voltage P-well 33, with the high voltage N-well 31 encasing P-well 33, all in a P-type substrate 30, allows a novel electrical erase method for the Array 1, when Array 1 is comprised of Flash memory cells. In this mode, P-well 33 and N-well 31 are shorted together, and a special erase voltage $V_{EE}$ of about +16V is used. The P-well 33 is electrically, the "Back Gate" of the cell 10. By biasing the Back Gate (P-well 33) to $V_{EE}$ and the control gate 11 to zero volts, the cell can be erased using Fowler-Nordheim tunneling. Heretofore, applying such voltage levels to the cell's well would have required applying the voltage to the substrate, which is not feasible.

The set of voltages involved in this mode of erasure are as shown in the fourth column of Table 1.

This mode of erasure further allows sectoring for selective erasure without requiring physical separation of the sectors, while allowing selection using zero volts or $V_{EE}$ on the word lines. The sectoring is by row. The selected row has its row line 15 at zero volts, with the non-selected row lines 15 being at $V_{EE}$ to protect their floating gate charge.

The terms "source" and "drain", as used herein, are interchangeable. For example, the voltages applied to the source 12 regions and the drain 13 regions of the memory cells 10 may be interchanged in the read example above.

For convenience, a table of read and write voltages is given in the Table 1 below:

TABLE 1

| Connection | Read | Write | Flash Erase |
|---|---|---|---|
| Selected Row Line | 3–5V | 11–13V | 0V (All) |
| Deselected Row Lines | 0V | 0V | +16V |
| Selected Source Line | 0V | 0V | Float or +16V (All) |
| Deselected Source Lines | Vx | Float | N/A |
| Selected Drain Line | 1–1.5V | 5–8V | Float or +16V |
| Deselected Drain Lines | Float | Float | N/A |
| P-well | 0V | 0V | +16V |
| N-well | 0V | 0V | +16V |

A method of making the devices of FIG. 1 will be described in reference to FIGS. 2 and 3a–3k. The method description relates only to the process for forming an X-cell array of cells 10 and for forming both the high-voltage P-channel transistors HVPT and low-voltage N-channel transistors LVNT of the logic circuitry on the same chip. While logic circuitry normally includes high-voltage N-channel transistors HVNT and low-voltage P-channel transistors LVPT, the additional steps used to form such high-voltage N-channel transistors HVNT and low-voltage P-channel transistors LVPT are well known and are therefore not included in the following discussion.

Figure 2:
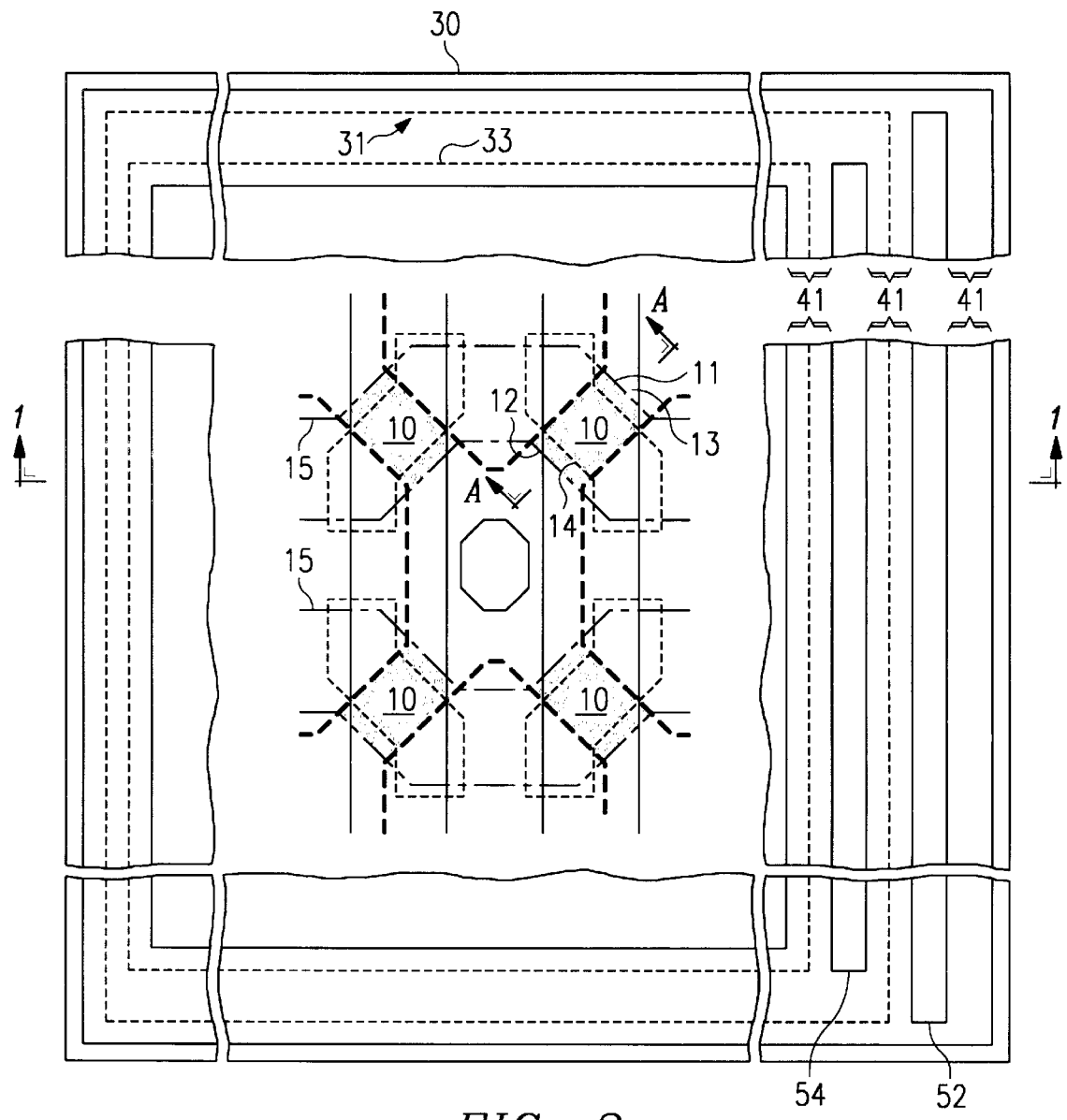
FIG. 2 is a plan view of a part of a semiconductor chip having memory cells according to one embodiment.

The starting material is p-epi on a wafer of p+ substrate 30, only a very small portion shown in the figures. The wafer is perhaps 8 inches in diameter, while the portion shown in FIG. 2 is very small fraction of that wafer. A pad oxide PO of about 400 Angstroms (A) is grown on the surface.

Figure 3A:
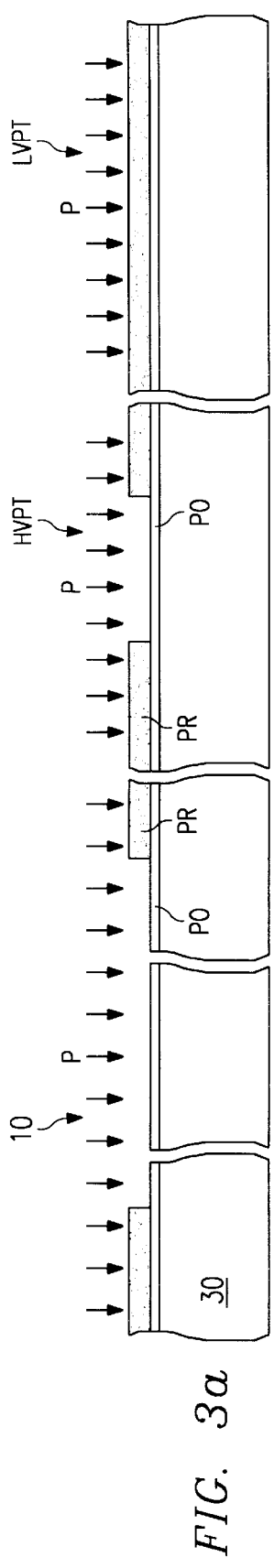
Figure 3B:
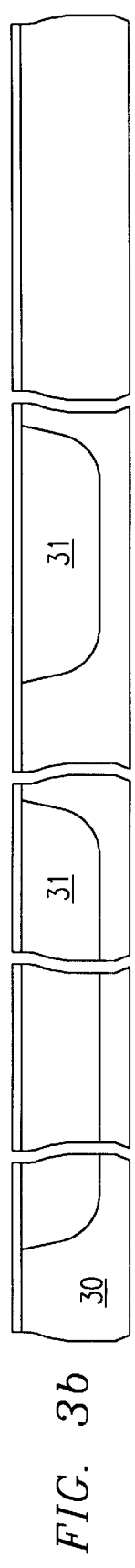

Referring now to FIGS. 3a, and 3b deep N-wells 31 are formed in the substrate 30 using the following process. Deep N-wells 31 are patterned with photoresist PR. The length and width of the implant area in the region where the memory cells 10 are to be formed must be sufficiently large that the dimensions encase a P-well 33 which in turn encases the memory array 1 or a subarray such as, e.g., a row. The length and the width of each implant area in the region where a high-voltage P-channel transistor HVPT is to be formed must be sufficiently large that the dimensions encase the source 12 and drain 13 of each of that transistor HVPT. The N-well 31 implant is then conducted, preferably with phosphorus P at a dose of about $4.0 \times 10^{12}$ ions/cm$^2$ and at an energy level of about 80 KeV. The photoresist is then stripped. An anneal of the N-well 31 dopant is performed at high temperature, perhaps 1200° C. for 700 minutes in a nitrogen atmosphere, to form a junction perhaps 7 microns (am) deep. This completes creation of deep N-well regions 31. The implantation defines the channel regions of high-voltage P-channel transistors HVPT.

Figure 3C:
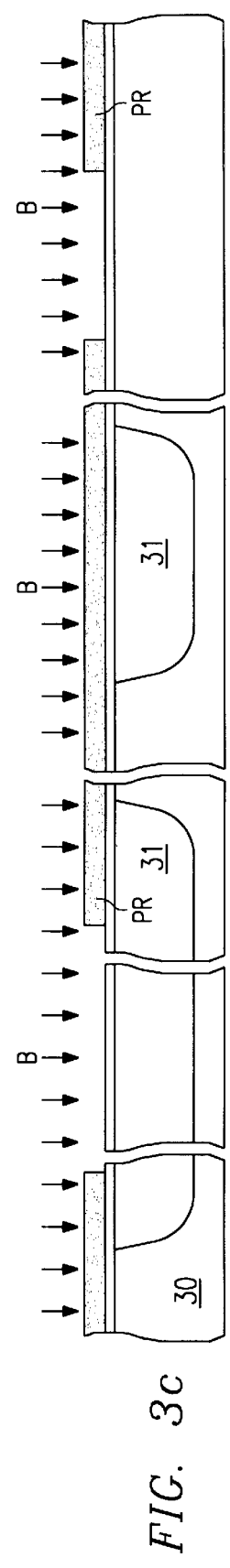
Figure 3D:
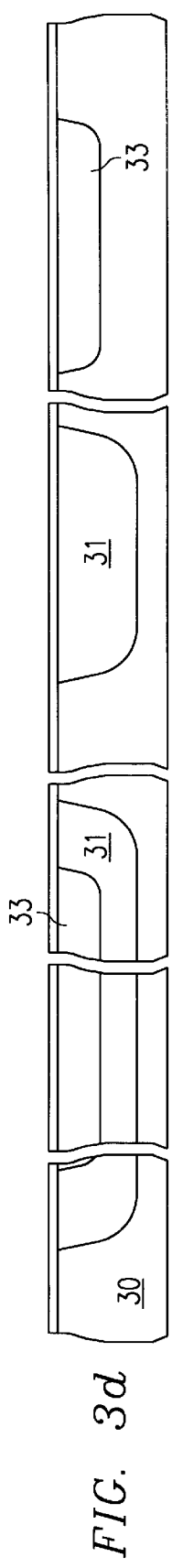

Referring now to FIGS. 3c and 3d, P-wells 33 are formed in each N-well 31 where the memory is to be formed and in each region where a low-voltage N-channel transistor LVNT is to be formed. The P-wells 33 are patterned with a photoresist layer PR and a P-type implant is performed, preferably with boron B at a dose of about $6.0 \times 10^{12}$ ions/$cm^2$ and an energy of approximately 40 KeV. In regions where the memory array 1 is to be formed, the length and width of the pattern must be sufficiently small to allow the P-well 33 to be encased by the deep N-well 31, but sufficiently large to encase the memory array (or sub-array). The depth of P-well 33 must not exceed the depth of N-well 31. The length and the width of each implant area in the region where a low-voltage N-channel transistor LVNT is to be formed must be sufficiently large that the dimensions encase the source 12 and drain 13 of each transistor LVNT. The implantation, defines the channel Ch regions of the memory cells 10 and of low voltage transistors LVNT. The photoresist layer is then stripped. An anneal of the P-well 33 dopant is performed at high temperature, perhaps 1100° C. for about 500 minutes in a nitrogen atmosphere, to form a junction perhaps 2 μm deep.

Referring to FIGS. 3e and 3f, further processing is described. A conventional nitride/oxide masking layer NOM is deposited (FIG. 3e) and patterned to define oxide regions 41 (FIG. 3f). Oxide regions 41 are grown by localized oxidation (LOCOS) to a thickness in the range of about 6300 to 7800 A (the thicknesses of the sections shown in FIGS. 3e–3k not being to scale). The growth occurs under an oxidizing atmosphere such as steam for about 600 minutes at about 900° C. The thermal oxide grows beneath the edges of the mask, creating a "bird's beak" instead of a sharp transition. The masking layers are removed using a hydrofluoric acid dip followed by a hot phosphoric acid etch.

After a cleanup step, a pre-gate oxide layer (not shown) is grown on the exposed silicon surface to a thickness of about 300 A.

At this point, a threshold-voltage-adjust implant may be performed in active areas including where channels Ch of memory cells 10 are to be located, those areas patterned using photoresist. For example, boron may be implanted in the memory cell regions at a dose of about $1 \times 10^{12}$ ions/$cm^2$ and at an energy level of about 40 KeV. The photoresist is stripped and the oxide over the active areas is stripped.

Referring to FIG. 3g, oxide is regrown over the structure using conventional techniques to form a relatively thin gate insulator layer 43 approximately 105 A thick. A first polycrystalline silicon layer ("poly 1") 14 about 1500 A thick, which will become floating gates of memory cells 10 is deposited over the face and is doped to be N+ using phosphorus. The first polysilicon layer 14 is patterned with a photoresist and strips are etched to partially form what will be floating gates of the memory cells 10. At the same time, the first polysilicon layer 14 is removed form the region where logic transistors such as high-voltage P-channel transistors HVPT and low-voltage voltage N-channel transistors LVNT are to be formed. This step is followed by a photoresist strip and clean-up.

Referring again to FIG. 3g, inter-level insulator layer 45 is then formed over the structure in the areas where memory cells 10 are to be formed. Inter-level insulator layer 45 may be formed by growing an oxide layer to about 120 Å, then depositing a nitride layer about 150 Å thick. The equivalent oxide thickness of the inter-level insulator is about 200 Å. The poly1 and inter-level insulator are etched. The patterned photoresist for this step is stripped.

Referring again to FIG. 3g, a second polycrystalline silicon layer ("poly 2") 15 about 4500 Å thick, which will become control gates/row lines of the memory array 1 and the gates of high-voltage P-channel transistors HVPT and low-voltage N-channel transistors LVNT of the logic circuitry, is then deposited over the face of the wafer and is highly doped with phosphorus to be N+.

Referring now to FIG. 3h, after de-glazing and patterning with photoresist, the gates of high-voltage P-channel transistors HVPT and low-voltage N-channel transistors LVNT of the logic circuitry are etched in the logic area of the chip. After again patterning with photo resist, a stack etch of (i) the second polysilicon layer 11,15, (ii) the inter-level insulator layer 45, and (iii) the first polysilicon strips 14 is performed in the memory area of the chip. This stack etch defines a plurality of elongated control gates 11/row lines 15. The row lines 15 connect rows of memory cells 10. This same stack etch separates and defines the remaining edges of the floating gates 14.

Referring again to FIG. 3h, a photoresist layer PR is deposited and patterned to open a window over the entire flash array 1. An arsenic implant As is performed at a dosage of about $5 \times 10^{15}$ ions/$cm^2$ at 120 KeV at zero degrees to the normal to create the sources 12 and drains 13 of memory cells 10.

Oxide is deposited and removed in conventional manner to form sidewall spacers 50 A cap oxide (not shown) about 300 Å thick is deposited over the surface.

Figure 3I:
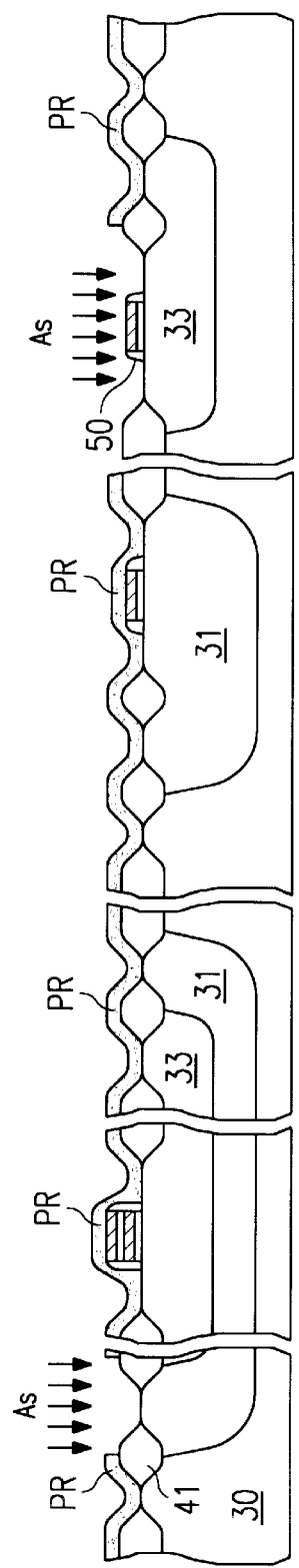

Referring to FIG. 3i, an arsenic implant As is performed at a dosage of about $3 \times 10^{15}$ ions/$cm^2$ at 120 KeV, using photoresist PR to protect areas of the chip not implanted, to create the sources 12 and drains 13 of the low-voltage N-channel transistors LVNT and the N+ region 52 is used to contact the N- well 31.

Figure 3J:
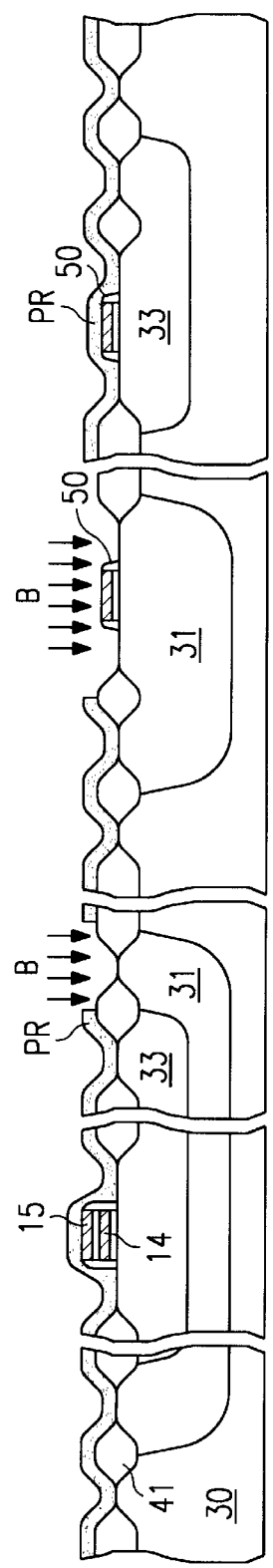

Referring to FIG. 3j, a boron implant B is performed at a dosage of about $4 \times 10^{14}$ ions/$cm^2$ at 20 KeV, using photoresist PR to protect areas of the chip not implanted, to create the sources 12 and drains 13 of the high-voltage P-channel transistors HVPT, and the P+region 54 is used to contact the P-well 33, to provide back gate contact BG to the cell 10.

Figure 3K:
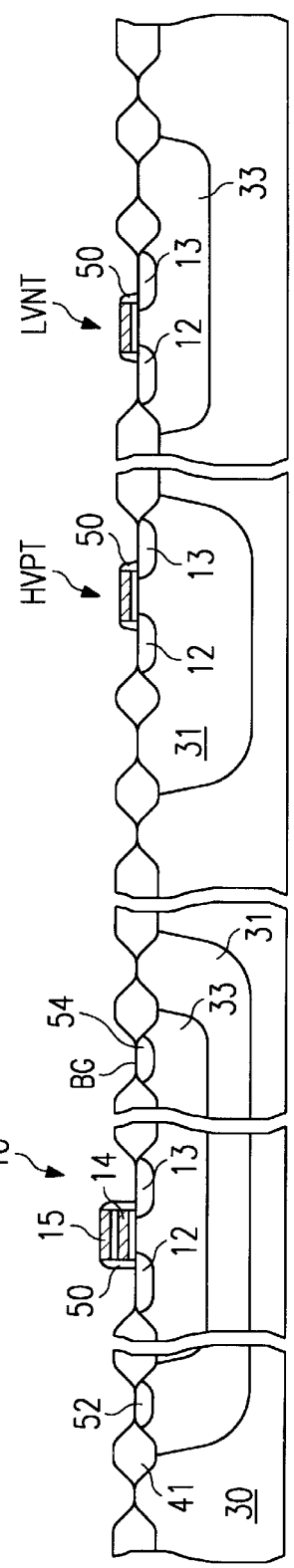

Referring to FIG. 3k, the dopants of memory cells 10, of low-voltage N-channel transistors LVNT and high-voltage P-channel transistors HVPT are driven with an anneal step at perhaps 900° C. for 20 minutes to complete formation of sources 12 and drains 13. A borophosphosilicate glass (BPSG) layer (not shown) may then be deposited over the face of the slice. Following the BPSG deposition, the substrate 30 is heated again at about 900° C. for about one hour in an annealing ambient to provide BPSG densification, repair implant damage and junction profile drive. Column lines 18 and 25 are formed from a layer or aluminum after etching holes to sources 12 and drains 13 and other place on the chip where connection is desired. At the same time that column lines 18 and 25 are formed, other conductors are formed for logic circuitry. Off-array contacts for both memory and logic are masked and etched through the BPSG layer.

One problem with an isolated P-well 33 is high well resistance. The high well resistance causes a significant voltage drop during programming. The voltage drop is decreased by the P+ contact areas 54, which should be strips, preferably extending along at least one side of each P-well 33.

Metal is deposited, masked and etched to form metal lines to respective diffused regions, such as terminals 52 and 54 and to the sources 12 and drains 13. Additional layers of dielectric and metal are deposited, patterened and etched as required for interconnect. This is followed by a protective overcoat process.

Decoder

The preferred embodiment includes a novel decoder circuit that isolates all decoding logic from the high voltages involved in programming Non-Volatile Programmable Arrays, allowing faster decoding as well as decoding speed that scales with process improvements, and also allowing easy conversion of a NVPA to a ROM array, as will be made clear by the description below.

Figure 4:
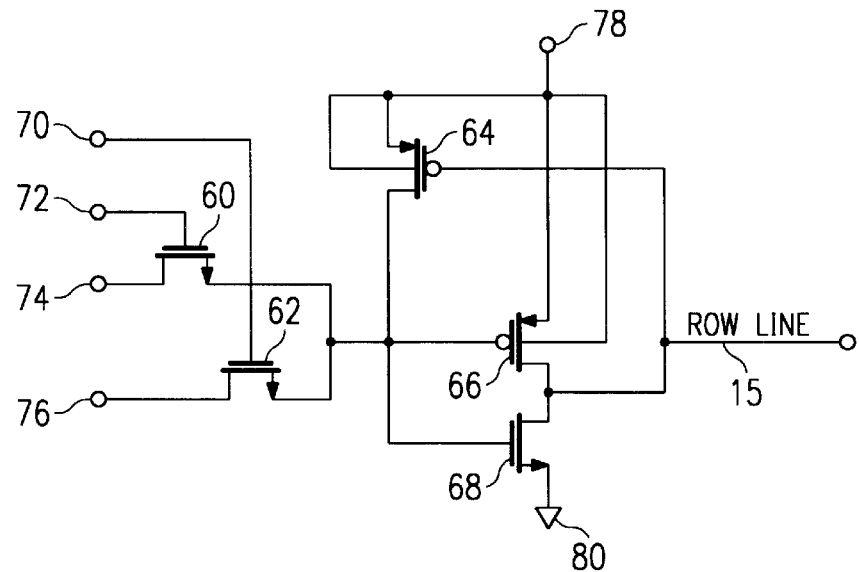
FIG. 4 is a schematic diagram of a prior art decoder circuit.

Referring now to FIG. 4, there is shown an exemplary prior art X Address Decoder, made up of high voltage N-Channel devices 60, 62 and 68, and high voltage P-Channel devices 64 and 66, all interconnected as shown. In addition, an input 70 is provided to receive a first logic signal, an input 72 is provided to receive a second logic signal and an input 74 is provided to receive a third logic signal. The first logic signal is the inverse of the second logic signal. Supply-level voltage Vdd is applied to input 76. High voltage $V_{GG}$ is provided to port 78, port 80 being connected to the ground line. The output 15 is a row line (see FIG. 1).

The voltages applied during programming and during Read to the inputs, and the resultant voltage on the row line 15, are all shown in the following Table 2:

TABLE 2

| Operation | 74 | 72 | 70 | Row Line | 78 |
|---|---|---|---|---|---|
| Read | 1 | X | X | 0 | Vdd |
|  | 0 | 1 | 0 | Vdd | Vdd |
|  | 0 | 0 | 1 | 0 | Vdd |
| Program | 1 | X | X | 0 | $V_{GG}$ |
|  | 0 | 1 | 0 | $V_{GG}$ | $V_{GG}$ |
|  | 0 | 0 | 1 | 0 | $V_{GG}$ |

It will be understood that the logic function performed by the circuit of FIG. 4 is exemplary, being selected solely for purposes of illustrating the application of the principles of the present invention to a specific decoding instance. There is no particular significance to the particular logic function selected.

As can be seen, because of the requirement that the row line 15 must carry $V_{GG}$ in program mode, devices 60, 62, 64, 66 and 68 are all high voltage devices. Thus, as mentioned above, this prior art decoder is slower than desired.

Figure 5:
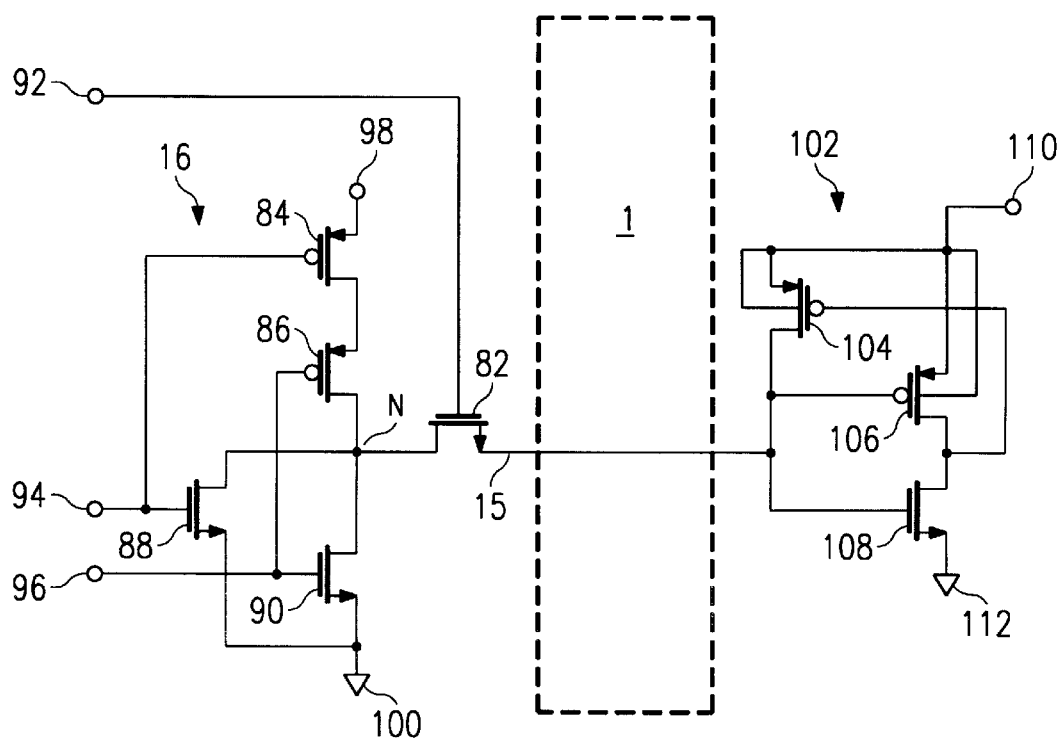
FIG. 5 is a schematic diagram of the decoder circuit of the preferred embodiment of the present invention in which Flash memory cells are used in Array 1.

Referring now to FIG. 5, a new decoder 17 according to the preferred embodiment is shown, implementing the same logic function as that implemented in the circuit of FIG. 4. In this circuit only one high voltage device is needed in the decoding logic function, namely N-Channel pass-gate device 82.

Also included in this circuit are low voltage p-channel devices 84 and 86 and low voltage n-channel devices 88 and 90, all interconnected as shown. Input 92 is provided to receive a voltage, Vph, which is at Vdd only in program mode, and during Read mode is at a "boot" level voltage Vbb, which is derived from Vdd, but pumped up to about seven or eight volts. Input 94 is provided to receive the third logic signal, while input 96 is provided to receive the first logic signal. Vdd is applied to port 98, while port 100 is connected to ground. As before, the output is row line 15.

The row line 15 passes through the array 1, and continues to a keeper circuit 102 on the opposite side of the array 1. Keeper circuit 102 comprises high voltage p-channel devices 104 and 106 and high voltage n-channel device 108, interconnected as shown. $V_{GG}$ is applied to port 110, while port 112 is connected to ground.

It will be appreciated that decoder circuit 17 performs the same logical function as the prior art decoder shown in FIG. 4. However, only one high voltage device, pass-gate 82 is needed in the logic decode portion, the actual logic function being performed by the other, low voltage devices 84, 86, 88 and 90. Thus, decoder circuit 17 is significantly faster than the circuit shown in FIG. 4, and in addition, the faster performance provided by these low voltage devices is scalable as the circuit is implemented in smaller technologies.

The keeper circuit operates as follows. During program mode, when the decode circuit 17 decodes a "select" condition for its row line 15, a logic level "1", indicating a select, appears on node N. Pass-gate 82, being enabled, passes this voltage, less Vt, to row line 15. This select voltage on line 15 is applied to the gate of device 108 in keeper circuit 102, turning it on which pulls the gate of device 104 to ground, turning device 104 on. The source of device 104 being connected to $V_{GG}$, when it is turned on it pulls the row line 15 up to $V_{GG}$, which is the desired voltage for the program mode. Finally, with row line 15 being pulled to $V_{GG}$, device 106 is turned off, which prevents $V_{GG}$ from being shorted to ground through device 108 during selection of row line 15 in program mode. When decode circuit 17 drives node N to zero, indicating deselect of row line 15, row line 15 is pulled to "0" which turns off device 108 and turns on device 106. With device 106 on, the gate of device 104 is pulled high turning device 104 off. Thus, the keeper circuit pull-up function is terminated, and row line 15 remains at logic level "0". Note that row select and deselect occur in READ mode. When the program mode starts port 110 is switched from Vdd to $V_{GG}$.

The pass gate 82 functions to protect the low power devices during program mode, since its gate is held at Vdd. This prevents the high voltage generated by the keeper circuit 102 from feeding back through pass gate 82. Thus the low voltage devices 84, 86, 88 and 90 are protected.

The pass gate 82 also functions, during Read mode, to beneficially eliminate the Vt voltage drop otherwise taken from the decoded row line signal applied at the input thereof, by having its gate held at Vbb during Read mode. This important function aids significantly as device sizes are shrunk and, correspondingly, logic level voltages decrease.

Convertible Array

Figure 6:
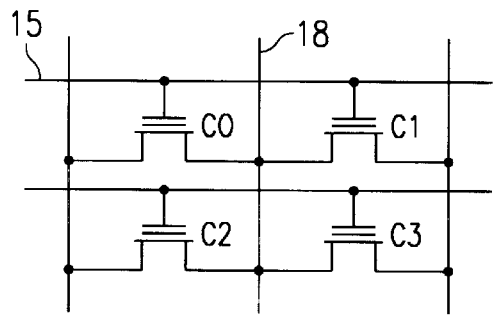
FIG. 6 is a circuit diagram of a small portion of the array of the preferred embodiment of the present invention, Array 1, in which Flash memory cells are used.
Figure 7:
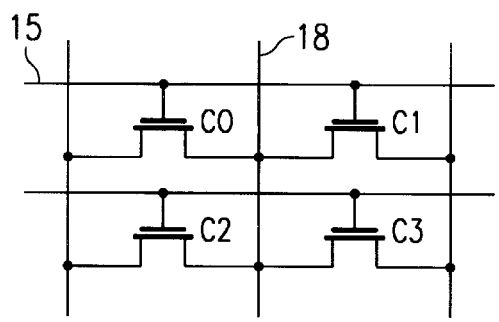
FIG. 7 is a circuit diagram of a small portion of Array 1, in which permanent ROM cells are used.

The Flash memory array 1 may be converted to a ROM array after, e.g., the program stored in Flash memory array 1 is proven, and it is desired to begin high volume production. Essentially, the floating gate of the cells 10 (FIG. 1) is eliminated, and the high voltage circuitry, not needed for the permanent ROM circuit, is not enabled. The novel arrangement, described hereinabove, for the provision of the high voltage circuitry makes this elimination of the high voltage circuitry relatively easy, as will now be described. The elimination of the floating gate is shown schematically in FIGS. 6 and 7, FIG. 6 showing a portion of the array including four cells, C0–C3, and FIG. 7 showing the same portion of the array with the floating gates removed.

Figure 8:
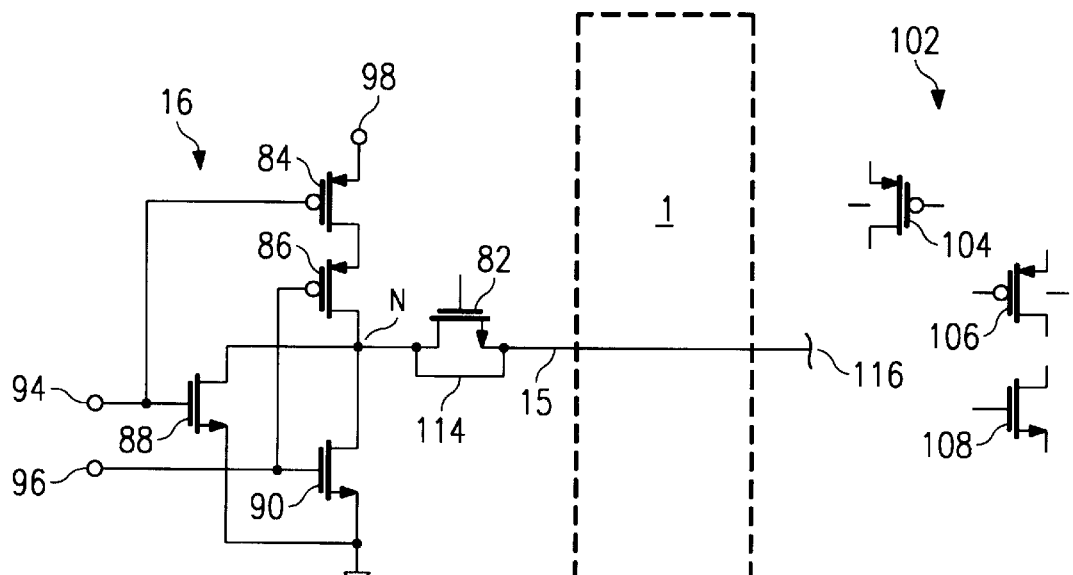
FIG. 8 is a circuit diagram like that of FIG. 5, but in which permanent ROM cells are used in Array 1.

FIG. 8 shows how the high voltage circuitry is disabled. As can be seen, the gate of pass-gate 82 is left unconnected to any circuit wire, and a short 114 is laid between the source and drain, effectively eliminating its function in the circuit. In addition, the other end 116 of row line 15 is left unconnected to keeper circuit 102. The keeper circuit 102 itself is not wire interconnected. All of the foregoing measures eliminating the high voltage circuitry is effected in the chip wiring using known techniques. Significant, however, is that only the wire masks need be changed to do this, and those changes to the wire masks are minimal. Thus costly wire re-routing is avoided.

Figure 9:
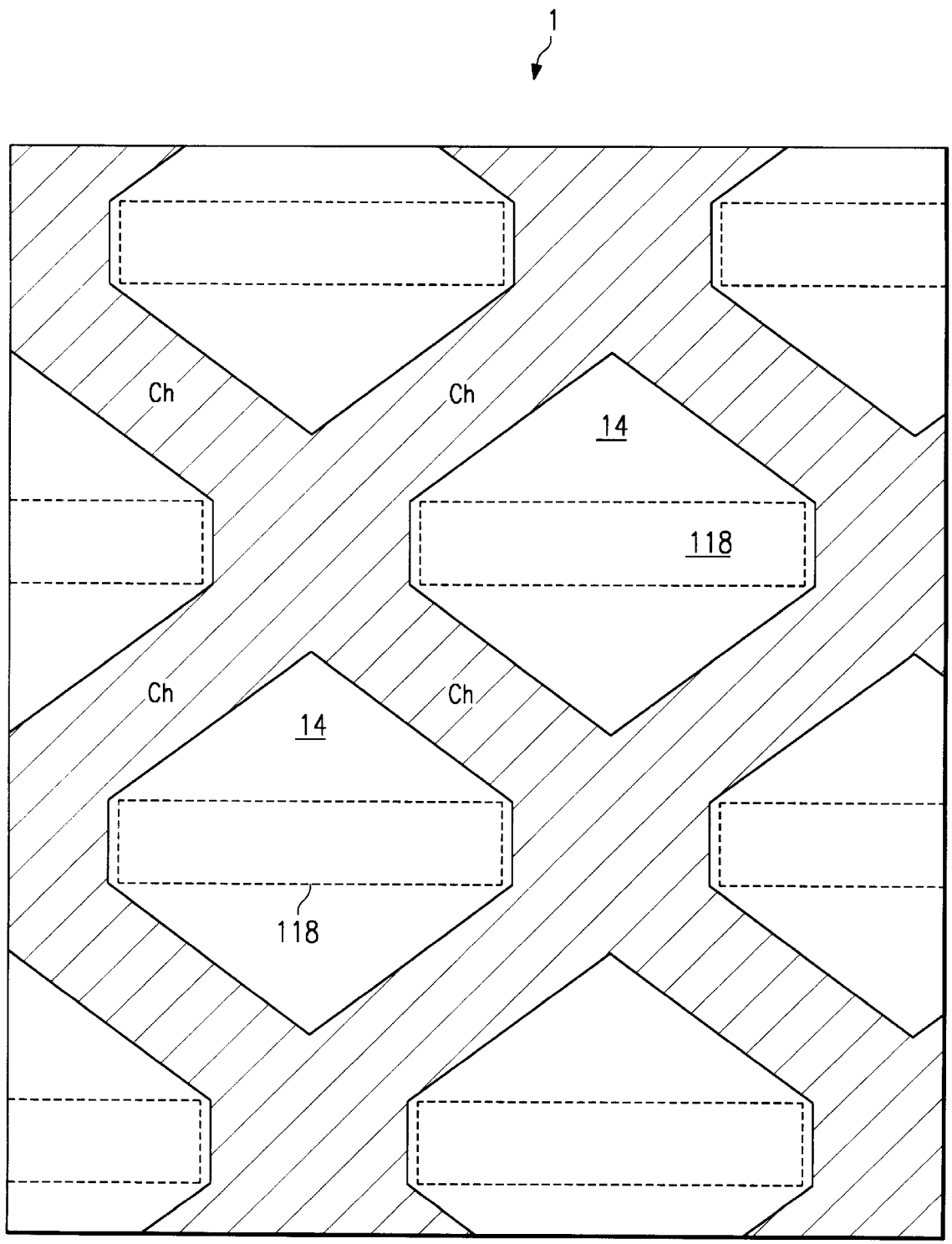
FIG. 9 is a plan view of a small portion of Array 1 in an intermediate stage of processing.
Figure 10:
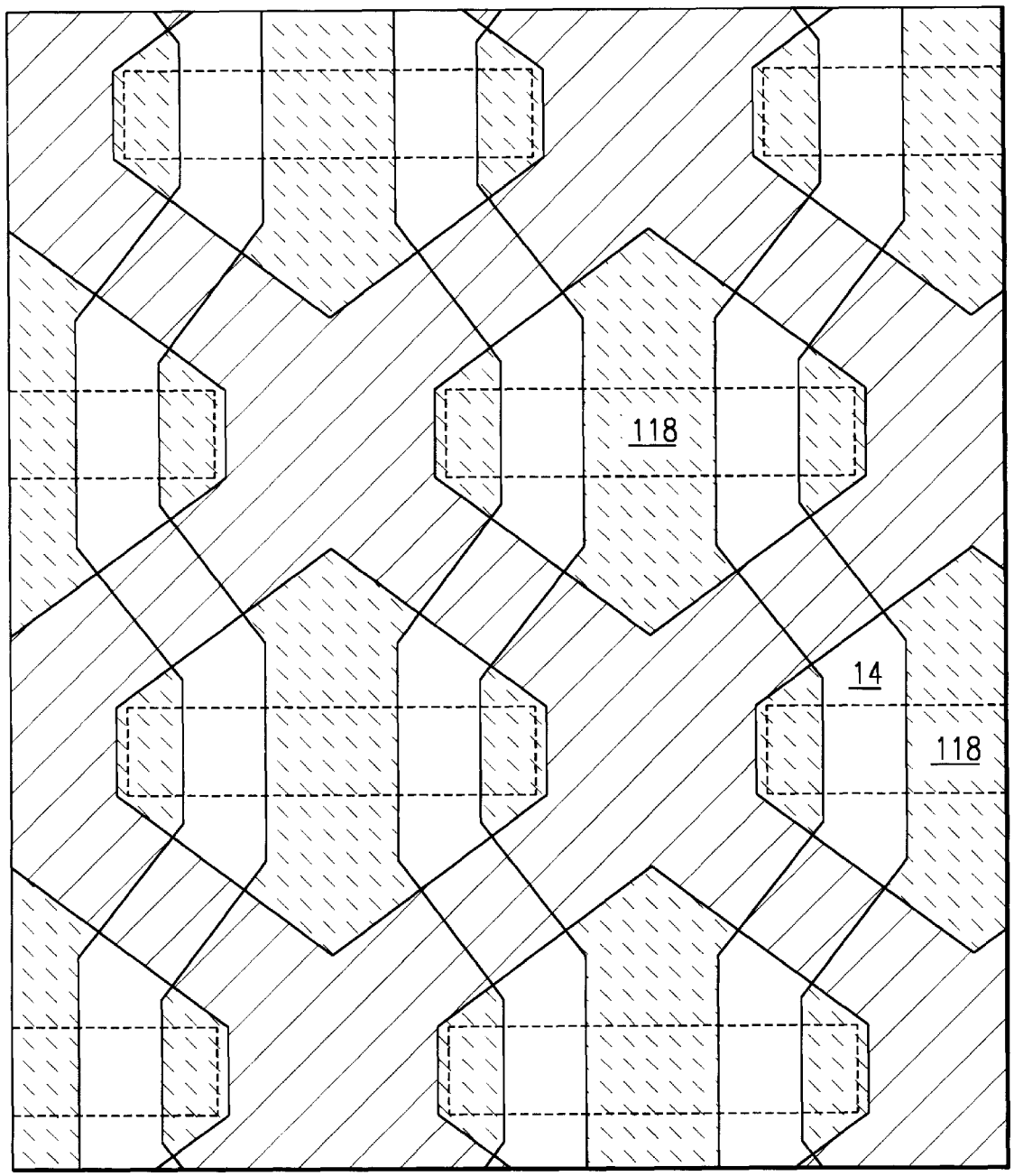
FIG. 10 is a plan view of the portion of Array 1 shown in FIG. 9, at a later stage of processing than that of FIG. 9.

The change in the process steps to eliminate the floating gate will now be described. FIG. 9 shows a top view of a section of array 1 in the process of being formed on a silicon substrate. This is a similar view to that in FIG. 2, but an earlier stage in the processing is shown in FIG. 9. As can be seen, channels Ch have been formed, and the first polysilicon layer 14 has been formed. The first polysilicon layer 14 includes strips 118 that are etched out as described above to define the edges of the floating gates that are formed in subsequent stages. FIG. 10 shows the floating gates 14 formed, as described above, during the etch step that creates the floating gates and control gates, with the strips 118 confining their extent to their individual cells. To form the ROM array, which involves the elimination of the floating gate, the steps of depositing the first polysilicon layer 14 and of forming strips 118, are eliminated.

Figure 11:
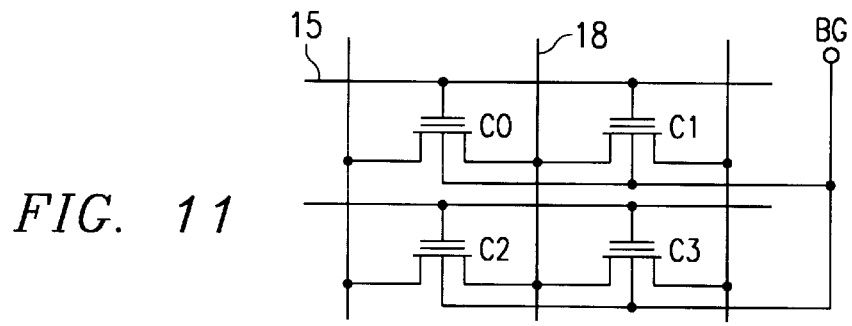
FIG. 11 is a circuit diagram of a small portion of Array 1, showing a representation of the back gates of the individual cells, and their interconnectedness.

FIG. 11 is a circuit diagram of a small portion of Array 1, showing a representation of the back gates BG of the individual cells, and their interconnectedness. The following columns show the steps of the ROM formation process next to the Flash memory formation process:

| FLASH | ROM (with no Power or HV) |
|---|---|
| Start | Start |
| ALIGN_0 | ALIGN_O |
| HV_NWELL | — |
| HV_PWELL | — |
| LV_NWELL | LV_NWELL |
| LV_PWELL | LV_PWELL |
| MOAT | MOAT |
| C/S | C/S |
| ARRAY VT | — |
| SLIT | — |
| POLY1 | — |
| LVPVT | LVPVT |
| LVNVT | — blanket implant |
| — | ROM_VT -high VT for selected bits |
| POLY2 | POLY2 |
| STAC | — |
| ARRAY_SD | — |
| NSD | NSD* |
| PSD | PSD* |
| CONT | CONT* |
| METAL1 | METAL1 |
| VIA | VIA |
| METAL2 | METAL2 |
| PO | PO |
| — — — — | — — — — |
| 22 Masks | 15 Masks |

The above steps correspond to those described in conjunction with the text describing FIGS. 3(a)–3(k). By way of clarification, however, note the following. ALIGN_0 is a conventional initial alignment step; HV_NWELL is the step of formation of Deep N-wells 31 for high voltage p-channel devices; HV_PWELL is the step of formation of P-wells for high voltage n-channel devices which, it will be recalled is not described hereinabove, but which is a well known process step; LV_NWELL is the step of formation of N-wells for low voltage p-channel devices, also not described hereinabove, but also a well known process step; LV_PWELL is the step of formation of P-wells 33 for low voltage n-channel devices and the memory array p-well; MOAT is the step of creating the isolation regions 41 of oxide; C/S is the step of formation of the channel stops; ARRAY VT is the step of threshold-voltage-adjust implant in the memory array; POLY1 is the step of defining the first polysilicon layer outside the memory array; SLIT is the step of removing the strips that define the ends of the floating gates; LVPVT is the implantation step by which the low voltage p-channel device threshold voltage is determined; LVNVT is the implantation step by which the low voltage n-channel device threshold voltage is determined; ROM_VT is a patterned implantation step by which the threshold voltage for selected bits in the ROM array is determined; POLY2 is the step of defining the second polysilicon layer; STAC is the step by which the control and floating gates are formed by etching; ARRAY_SD is an implant step by which the memory array sources and drains are formed; NSD is the step by which the n-channel source drain regions are formed; PSD is the step by which the p-channel source drain regions are formed; CONT is the step of contact formation; METAL1 is the step of first level wiring; VIA is via formation for METAL1/METAL2 interconnect; METAL2 is the step of second level wiring; and PO is the step of passivation.

Although the present invention and its advantages have been described in detail, it should be understood that various changes, substitutions and alterations can be made herein without departing from the spirit and scope of the invention as defined by the appended claims.

What is claimed is:

1. A non-volatile, integrated circuit memory programmable by having a first voltage applied thereto, comprising:

an array of memory cells, said cells being arranged in rows, each cell having a floating gate therein for storing charge thereon to program the cell and a control gate for reading the cell, the array having a plurality of row lines, a plurality of column lines and a plurality of output lines;

a circuit having a plurality of input lines for each row in the array, said input lines receiving row address signals, and said circuit having as outputs the row lines, comprising a logic circuit associated with each row line, comprising a plurality of low power logic devices interconnected to perform a predetermined logic function on the row address signals on said input lines to apply a selection signal to a row node for a selected one of said row lines, and a high power pass device associated with each row line, having one of its source and drain connected to the control gates of a row of memory cells in said array, having the other of its source and drain connectable to said row node and having its gate connectable to a second voltage, lower than said first voltage, so as to couple said selection signal on said row node to said row line; and a keeper circuit associated with each row line and connectable to said first voltage for sensing said signal on said row line and in response thereto for coupling said first voltage to said row line, whereby said high power pass device protects said logic circuit from harmful effects of said first voltage.

2. A non-volatile, integrated circuit memory readable by having first voltage applied thereto, comprising:

an array of memory cells, said cells being arranged in rows, each cell having a floating gate therein for storing charge thereon to program the cell and a control gate for reading the cell, the array having a plurality of row lines, a plurality of column lines and a plurality of output lines; and a circuit having a plurality of input lines for each row in the array, said input lines receiving row address signals, and said circuit having as outputs the row lines, comprising a logic circuit associated with each row line, comprising a plurality of low power logic devices interconnected to perform a predetermined logic function on the row address signals on said input lines to apply a signal to a row node for a selected one of said row lines, and a high power pass device associated with each row line, having one of its source and drain connected to the control gates of a row of memory cells in said array, having the other of its source and drain connected to said row node and having its gate connectable to a second voltage, higher than said first voltage, so as to couple said signal on said row node to said row line;

whereby said high power pass devices couple the signals provided by said logic circuit to said control gates with a minimal voltage drop thereacross.

* * * * *